United States Patent
Kim et al.

(10) Patent No.: US 8,558,323 B2
(45) Date of Patent: *Oct. 15, 2013

(54) THIN FILM TRANSISTORS HAVING MULTI-LAYER CHANNEL

(75) Inventors: Sun-il Kim, Yongin-si (KR); Young-soo Park, Yongin-si (KR); Jae-chul Park, Seoul (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 81 days.

This patent is subject to a terminal disclaimer.

(21) Appl. No.: 12/923,472

(22) Filed: Sep. 23, 2010

(65) Prior Publication Data

US 2011/0042669 A1    Feb. 24, 2011

Related U.S. Application Data

(63) Continuation of application No. 11/987,499, filed on Nov. 30, 2007, now Pat. No. 8,143,678.

(30) Foreign Application Priority Data

Feb. 9, 2007    (KR) .................. 10-2007-0013747

(51) Int. Cl.
```
H01L 29/76      (2006.01)
H01L 29/94      (2006.01)
H01L 31/062     (2012.01)
H01L 31/113     (2006.01)
H01L 31/119     (2006.01)
```
(52) U.S. Cl.
USPC .................. 257/404; 257/E27.112

(58) Field of Classification Search
USPC .............. 257/43, E29.291, E29.294
See application file for complete search history.

(56) References Cited

U.S. PATENT DOCUMENTS

| | | |
|---|---|---|
| 4,327,739 A | 5/1982 | Chmiel et al. |
| 4,969,023 A | 11/1990 | Svedberg |
| 5,338,697 A | 8/1994 | Aoki et al. |
| 6,229,188 B1 | 5/2001 | Aoki et al. |
| 6,289,230 B1 | 9/2001 | Chaiken et al. |

(Continued)

FOREIGN PATENT DOCUMENTS

| | | |
|---|---|---|
| JP | 2003-086808 | 3/2003 |
| JP | 2004-235180 A | 8/2004 |

(Continued)

OTHER PUBLICATIONS

Office Action mailed Feb. 17, 2011 for co-pending U.S. Appl. No. 11/987,499.

(Continued)

*Primary Examiner* — Howard Weiss
(74) *Attorney, Agent, or Firm* — Harness, Dickey & Pierce, P.L.C.

(57) ABSTRACT

A transistor may include: a gate insulting layer, a gate electrode formed on a bottom side of the gate insulating layer, a channel layer formed on a top side of the gate insulating layer, a source electrode that contacts a first portion of the channel layer, and a drain electrode that contacts a second portion of the channel layer. The channel layer may have a double-layer structure, including an upper layer and a lower layer. The upper layer may have a carrier concentration lower than that of the lower layer. The upper layer may be doped with a carrier acceptor in order to have an electrical resistance higher than that of the lower layer.

6 Claims, 11 Drawing Sheets

(56) References Cited

U.S. PATENT DOCUMENTS

| | | |
|---|---|---|
| 6,541,829 B2 | 4/2003 | Nishinohara et al. |
| 7,227,196 B2 | 6/2007 | Burgener et al. |
| 7,675,126 B2 | 3/2010 | Cho |
| 2003/0231099 A1 | 12/2003 | Schemenaur et al. |
| 2005/0017302 A1 | 1/2005 | Hoffman |
| 2006/0108636 A1 | 5/2006 | Sano et al. |
| 2006/0113536 A1 | 6/2006 | Kumomi et al. |
| 2006/0113539 A1 | 6/2006 | Sano et al. |
| 2008/0023703 A1 | 1/2008 | Hoffman et al. |
| 2008/0182358 A1 | 7/2008 | Cowdery-Corvan et al. |

FOREIGN PATENT DOCUMENTS

| | | |
|---|---|---|
| JP | 2005-118320 | 5/2005 |
| JP | 2006-165529 A | 6/2006 |
| JP | 2007-073563 | 3/2007 |
| JP | 2007-073701 | 3/2007 |
| JP | 2007-073704 | 3/2007 |
| JP | 2008-042088 A | 2/2008 |
| KR | 10-2006-0058563 | 5/2006 |
| KR | 10-2006-0061838 | 6/2006 |
| KR | 10-2006-0089144 | 8/2006 |
| KR | 1020060132659 A | 12/2006 |
| WO | WO 2005/074038 | 8/2005 |
| WO | WO 2005/088726 | 9/2005 |

OTHER PUBLICATIONS

Office Action mailed Sep. 20, 2010 for co-pending U.S. Appl. No. 11/987,499.

Korean Office Action dated Mar. 4, 2013, issued in Korean Patent Application No. 10-2007-0013747, with English translation.

Office Action issued Mar. 19, 2013 in Japanese Patent Application No. 2008-009971, with English translation.

THIN FILM TRANSISTORS HAVING MULTI-LAYER CHANNEL

PRIORITY STATEMENT

This application is a continuation application of U.S. patent application Ser. No. 11/987,499, filed on Nov. 30, 2007, now U.S. Pat. No. 8,143,678, and claims the associated benefit under 35 U.S.C. §120. The entire contents of parent U.S. patent application Ser. No. 11/987,499, entitled "THIN FILM TRANSISTORS HAVING MULTI-LAYER CHANNEL", are incorporated herein by reference. This application also claims priority from Korean Patent Application No. 10-2007-0013747, filed on Feb. 9, 2007, in the Korean Intellectual Property Office (KIPO), the entire contents of which are incorporated herein by reference.

BACKGROUND

1. Field

Example embodiments relate to semiconductor devices and/or methods of manufacturing the same. Also, example embodiments relate to thin film transistors and/or methods of manufacturing the same.

2. Description of Related Art

Thin film transistors (TFTs) are used as switching devices in flat panel display apparatuses, such as a liquid crystal display apparatus or an organic light emitting display apparatus. The mobility or leakage current of the TFTs may be greatly affected by the material and/or the state of a channel layer of the TFT, which is a path along which charge carriers move.

In commercially produced liquid crystal display apparatuses, the channel layer of the TFT is mainly an amorphous silicon layer whose charge mobility is approximately 0.5 cm$^2$/Vs and, thus, very low. Therefore, it is difficult to increase the operational speed of the commercially produced liquid crystal display apparatuses.

Accordingly, research is being conducted on using other materials as the channel layer of the TFT, whose charge mobility may be higher than that of the amorphous silicon layer.

SUMMARY

Example embodiments may provide TFTs having a channel layer that has a charge mobility greater than an amorphous silicon layer and/or that may reduce and/or prevent the characteristics of the channel layer from degrading due to plasma.

Example embodiments also may provide methods of manufacturing the TFTs.

According to example embodiments, a thin film transistor may include: a gate insulting layer; a gate electrode formed on a first side of the gate insulating layer; a channel layer formed on a second side of the gate insulating layer; a source electrode that contacts a first portion of the channel layer; and/or a drain electrode that contacts a second portion of the channel layer. The channel layer may have a double-layer structure, including an upper layer and a lower layer. The upper layer may have a carrier concentration lower than that of the lower layer. The channel layer may be formed of a ZnO based material.

The channel layer may be formed of $a(In_2O_3) \cdot b(Ga_2O_3) \cdot c(ZnO)$, where a, b, and c are real numbers such that a≥0, b≥0, and c>0.

The upper layer may be doped with a carrier acceptor in order to have an electrical resistance higher than that of the lower layer.

The carrier acceptor may include one or more of Cu, Ag, Li, Na, K, Mg, Ca, Be, Au, Rg, Ni, Co, Rh, Pd, Ir, Pt, V, Nb, Ta, and N.

Cu content of the carrier acceptor may be 29-44 atomic % in the upper layer.

A thickness of the upper layer may be 10-100 nm.

According to example embodiments, a method of manufacturing a thin film transistor may include: forming a channel layer on a substrate; forming a source electrode, that contacts a first portion of the channel layer, on the substrate; forming a drain electrode, that contacts a second portion of the channel layer, on the substrate; forming a gate insulating layer, that covers the channel layer, the source electrode, and the drain electrode, on the substrate; and/or forming a gate electrode on the gate insulating layer above the channel layer. The channel layer may have a double-layer structure, including an upper layer and a lower layer. The upper layer may have a carrier concentration lower than that of the lower layer. The channel layer may be formed of a ZnO based material.

The channel layer may be formed in the double-layer structure by doping a carrier acceptor into an upper part of the channel layer.

The carrier acceptor may include one or more of Cu, Ag, Li, Na, K, Mg, Ca, Be, Au, Rg, Ni, Co, Rh, Pd, Ir, Pt, V, Nb, Ta, and N.

The upper layer may include a carrier acceptor, and wherein the upper layer may be formed using a sputtering method with a target doped with the carrier acceptor.

The upper layer may include a carrier acceptor, wherein the upper layer is formed using a sputtering method or an evaporation method that uses or sputtering and evaporation methods that use at least two targets, and wherein at least one of the targets is doped with the carrier acceptor.

The carrier acceptor comprises Cu, wherein the upper layer is formed using a sputtering method, and wherein Cu content of the upper layer is 29-44 atomic %.

The upper layer may be formed to have a thickness of 10-100 nm.

The upper layer may include a carrier acceptor, and wherein the upper layer may be formed using a gas that comprises the carrier acceptor.

According to example embodiments, a method of manufacturing a thin film transistor may include: forming a gate electrode on a substrate; forming a gate insulating layer, that covers the gate electrode, on the substrate; forming a channel layer on the gate insulating layer, above the gate electrode; forming a source electrode, that contacts a first portion of the channel layer, on the gate insulating layer; and/or forming a drain electrode, that contacts a second portion of the channel layer, on the gate insulating layer. The channel layer may have a double-layer structure, including an upper layer and a lower layer. The upper layer may have a carrier concentration lower than that of the lower layer. The channel layer may be formed of a ZnO based material.

The channel layer may be formed in the double-layer structure by doping a carrier acceptor into an upper part of the channel layer.

The carrier acceptor may include one or more of Cu, Ag, Li, Na, K, Mg, Ca, Be, Au, Rg, Ni, Co, Rh, Pd, Ir, Pt, V, Nb, Ta, and N.

The upper layer may include a carrier acceptor, and wherein the upper layer may be formed using a sputtering method with a target doped with the carrier acceptor.

The upper layer may include a carrier acceptor, wherein the upper layer may be formed using a sputtering method or an evaporation method that uses or sputtering and evaporation methods that use at least two targets, and wherein at least one of the targets may be doped with the carrier acceptor.

The carrier acceptor may include Cu, wherein the upper layer may be formed using a sputtering method, and wherein Cu content of the upper layer may be 29-44 atomic %.

The upper layer may be formed to have a thickness of 10-100 nm.

The upper layer may include a carrier acceptor, and wherein the upper layer may be formed using a gas that comprises the carrier acceptor.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Figure 1:
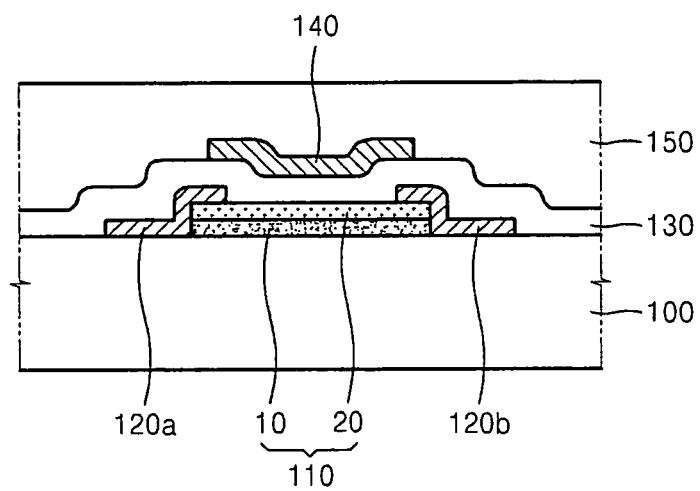
FIG. 1 is a cross-sectional view illustrating a TFT according to example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a cross-sectional view illustrating a TFT according to example embodiments. The TFT may have a top gate structure in which a gate electrode 140 may be formed above a channel layer 110.

Referring to FIG. 1, the channel layer 110 may be formed on a substrate 100. The substrate 100 may comprise one or more of a silicon substrate, a glass substrate, and a plastic substrate. The substrate 100 may be a transparent, translucent, and/or opaque substrate. A source electrode 120a and/or a drain electrode 120b, that respectively contact different portions (e.g., different ends or opposite ends) of the channel layer 110, may be formed on the substrate 100. The source electrode 120a and/or the drain electrode 120b may be, for example, a metal layer (e.g., a single Molybdenum (Mo)

layer, a multiple metal layer that includes a Mo layer, or other metal layer or layers). A gate insulating layer 130, that may cover the channel layer 110, the source electrode 120a, and/or the drain electrode 120b, may be formed on the substrate 100. The gate electrode 140 may be formed on the gate insulating layer 130. The gate electrode 140 may be located above the channel layer 110. The gate electrode 140 may be formed of the same metal(s) or a different metal(s) than used in forming the source electrode 120a and/or the drain electrode 120b. A passivation layer 150, that may cover the gate electrode 140, may be formed on the gate insulating layer 130. The gate insulating layer 130 and/or the passivation layer 150 may be, for example, a $SiO_x$ layer and/or a $Si_xN_y$ layer (where x and y are real numbers such that x≥1 and y≥1).

The channel layer 110 may have, for example, a thickness greater than or equal to about 30 nm and less than or equal to about 200 nm. The source electrode 120a may have, for example, a thickness greater than or equal to about 10 nm and less than or equal to about 200 nm. Similarly, the drain electrode 120b may have, for example, a thickness greater than or equal to about 10 nm and less than or equal to about 200 nm. The gate insulating layer 130 may have, for example, a thickness greater than or equal to about 100 nm and less than or equal to about 300 nm. The gate electrode 140 may have, for example, a thickness greater than or equal to about 100 nm and less than or equal to about 300 nm. The passivation layer 150 may have, for example, a thickness greater than or equal to about 50 nm and less than or equal to about 2000 nm.

The channel layer 110 may have a double-layer structure in which a lower layer 10 and an upper layer 20 may be sequentially stacked. In this double-layer structure of the channel layer 110, the upper layer 20 may have a carrier concentration lower than that of the lower layer 10. The lower layer 10 may be a main current path and/or the upper layer 20 may be a sub-current path. The channel layer 110 may be a ZnO based material layer, for example, a Ga—In—Zn—O material layer. The Ga—In—Zn—O material layer may be a a($In_2O_3$).b($Ga_2O_3$).c(ZnO) material layer. In example embodiments, a, b, and c may be real numbers such that a≥0, b≥0, and/or c>0. In example embodiments, a, b, and c may be real numbers such that a≥1, b≥1, and/or 0<c≤1.

The Ga—In—Zn—O material layer may be an N-type semiconductor material layer. The upper layer 20 of the channel layer 110 may be doped with a carrier acceptor, for example, an electron acceptor. Accordingly, the upper layer 20 may have a carrier concentration lower than that of the lower layer 10. In example embodiments, the carrier acceptor may comprise one or more of copper (Cu), silver (Ag), lithium (Li), sodium (Na), potassium (K), magnesium (Mg), calcium (Ca), beryllium (Be), gold (Au), roentgenium (Rg), nickel (Ni), cobalt (Co), rhodium (Rh), palladium (Pd), iridium (Ir), platinum (Pt), vanadium (V), niobium (Nb), tantalum (Ta), and nitrogen (N). In example embodiments, the carrier acceptor may comprise one or more of Cu, Ag, Li, Mg, Ni, Co, and N.

The carrier concentration of the upper layer 20 may be lower than that of the lower layer 10 and, thus, the upper layer 20 may have an electrical resistance higher than that of the lower layer 10. Since the upper layer 20 may have an electrical resistance that is relatively greater than that of the lower layer 10, even if the upper layer 20 is exposed to plasma, the electrical resistance of the upper layer 20 may be relatively constant. Thus, the problem of reducing the electrical resistance of the channel layer 110 due to plasma may be reduced and/or prevented.

Figure 2:
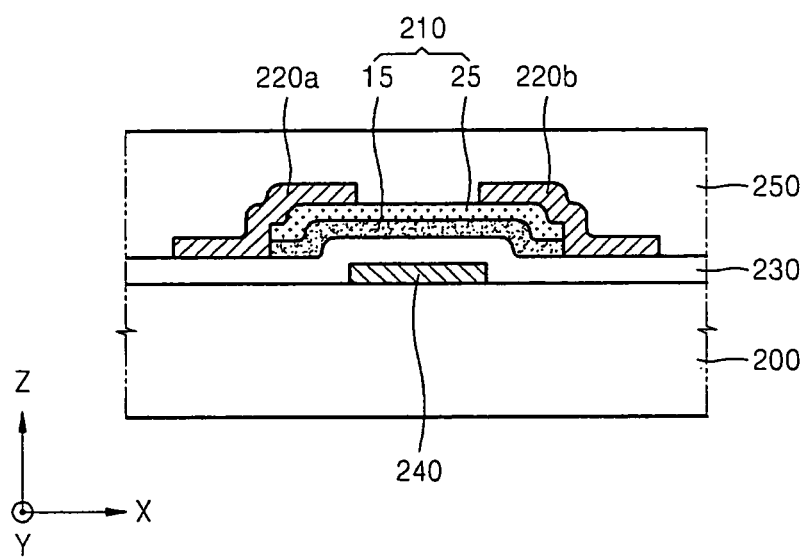
FIG. 2 is a cross-sectional view illustrating a TFT according to example embodiments.

FIG. 2 is a cross-sectional view illustrating a TFT according to example embodiments. The TFT may have a bottom gate structure in which a gate electrode 240 may be formed below a channel layer 210.

Referring to FIG. 2, the gate electrode 240 may be formed on a substrate 200, and a gate insulating layer 230, that may cover the gate electrode 240, may be formed on the substrate 200. The channel layer 210 may be formed on the gate insulating layer 230 above the gate electrode 240. The channel layer 210 may have a double-layer structure comprising an upper layer 25 and a lower layer 15. The upper layer 25 of the channel layer 210 may have a carrier concentration lower than that of the lower layer 15 of the channel layer 210. The width of the channel layer 210 in an X-axis direction may be greater than a width of the gate electrode 240 in the X-axis direction. A source electrode 220a and/or a drain electrode 220b, that respectively contact different portions (e.g., different ends or opposite ends) of the channel layer 210, may be formed on the gate insulating layer 230. A passivation layer 250, that may cover the channel layer 210, the source electrode 220a, and/or the drain electrode 220b, may be formed on the gate insulating layer 230. The materials and thicknesses of the substrate 200, the channel layer 210, the source electrode 220a, the drain electrode 220b, the gate insulating layer 230, the gate electrode 240, and/or the passivation layer 250 of the TFT of FIG. 2 may be similar or identical to the materials and thicknesses of the substrate 100, the channel layer 110, the source electrode 120a, the drain electrode 120b, the gate insulating layer 130, the gate electrode 140, and/or the passivation layer 150 of the TFT of FIG. 1.

FIGS. 3A through 3F are cross-sectional views illustrating a method of manufacturing the TFT of FIG. 1, according to example embodiments. Like reference numerals of the elements of FIGS. 3A through 3F are used to indicate elements that may be similar or identical to the elements of FIG. 1.

Figure 3A:
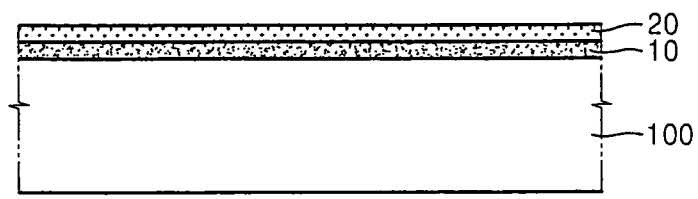
FIGS. 3A through 3F are cross-sectional views illustrating a method of manufacturing the TFT of FIG. 1, according to example embodiments.

Referring to FIG. 3A, the lower layer 10 may be formed on the substrate 100. The lower layer 10 may be a Ga—In—Zn—O layer formed using a physical vapor deposition (PVD) method or methods, such as a sputtering method and/or an evaporation method. At least one target may be used to form the lower layer 10. The at least one target may comprise one or more of $In_2O_3$, $Ga_2O_3$, and ZnO. The lower layer 10 may be a a($In_2O_3$).b($Ga_2O_3$).c(ZnO) layer. In example embodiments, a, b, and c may be real numbers such that a≥0, b≥0, and/or c>0. In example embodiments, a, b, and c may be real numbers such that a≥1, b≥1, and/or 0<c≥1.

After the lower layer 10 is formed, an upper layer 20 may be formed on the lower layer 10. The upper layer 20 may be a Ga—In—Zn—O layer doped with a carrier acceptor. The upper layer 20 may be formed using a PVD method or methods, such as a sputtering method and/or an evaporation method. The carrier acceptor may comprise one or more of Cu, Ag, Li, Na, K, Mg, Ca, Be, Au, Rg, Ni, Co, Rh, Pd, Ir, Pt, V, Nb, Ta, and N. The carrier acceptor may be included in at least one of a target and/or a gas used in the PVD method or methods of forming the upper layer 20. For example, the target may include Cu and one or more of $In_2O_3$, $Ga_2O_3$, and ZnO. The gas may include nitrogen gas.

The lower layer 10 and/or the upper layer 20 may be formed using an in-situ process.

Figure 3B:
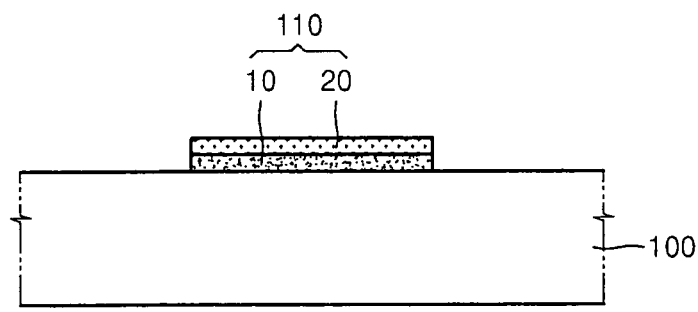

Referring to FIG. 3B, the channel layer 110, that may have a double layer, may be formed by patterning the lower layer 10 and/or the upper layer 20.

Figure 3C:
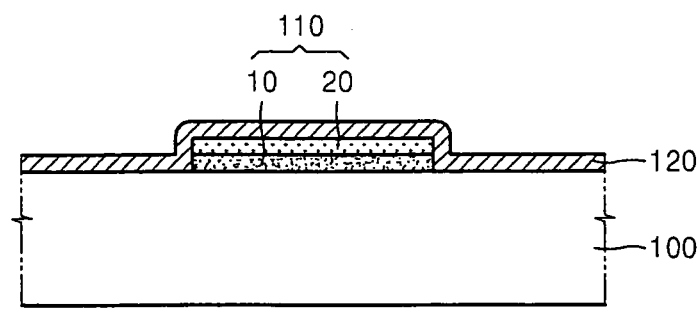

Referring to FIG. 3C, a source and drain electrode layer 120, that may cover the channel layer 110, may be formed on the substrate 100. The source and drain electrode layer 120 may be a metal layer (e.g., a single Mo layer, a multiple metal layer that includes a Mo layer, or other metal layer or layers).

Figure 3D:
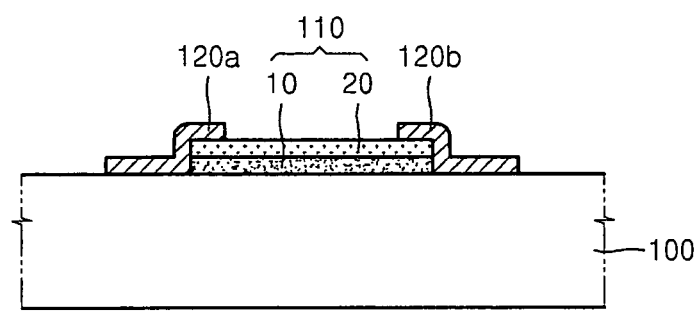

Referring to FIG. 3D, a portion of an upper surface of the upper layer 20 may be exposed and/or the source electrode 120a and/or the drain electrode 120b, that respectively contact different portions of the channel layer 110, may be formed by patterning the source and drain electrode layer 120 using a method, for example, a dry etching method, that may or may not be predetermined.

Figure 3E:
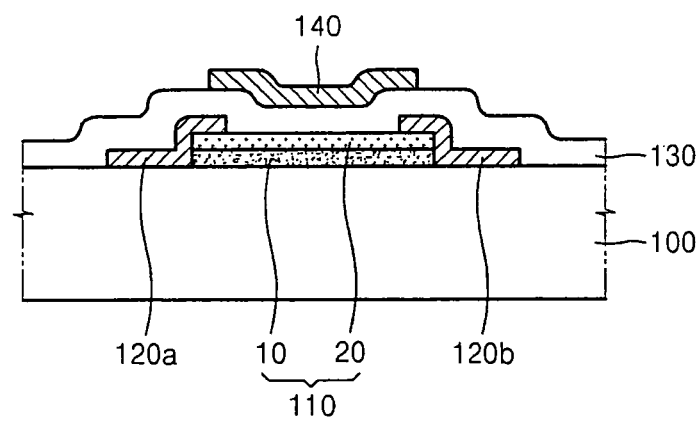

Referring to FIG. 3E, the gate insulating layer 130, that may cover the exposed portion of the upper layer 20, the source electrode 120a, and/or the drain electrode 120b, may be formed on the substrate 100. The gate insulating layer 130 may be formed, for example, using a plasma enhanced chemical vapor deposition (PECVD) method. The gate insulating layer 130 may be formed of $SiO_x$ and/or $Si_xN_y$. Then, a gate electrode 140 may be formed on the gate insulating layer 130. The gate electrode 140 may be located above the channel layer 110. The gate electrode 140 may be formed of the same or different material(s) than that used in forming the source and drain electrode layer 120.

Figure 3F:
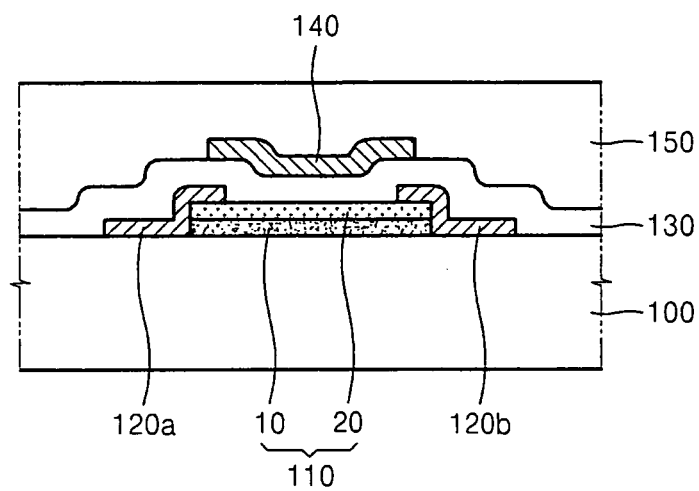

Referring to FIG. 3F, the passivation layer 150, that may cover the gate electrode 140, may be formed on the gate insulating layer 130. The passivation layer 150 may be formed, for example, by a deposition method using plasma. The passivation layer 150 may be formed of $SiO_x$ and/or $Si_xN_y$. The TFT formed by the method described above may be annealed at a temperature, for example, greater than or equal to about 100° C. and less than or equal to about 600° C.

FIGS. 4A through 4D are cross-sectional views illustrating a method of manufacturing the TFT of FIG. 2, according to example embodiments.

Figure 4A:
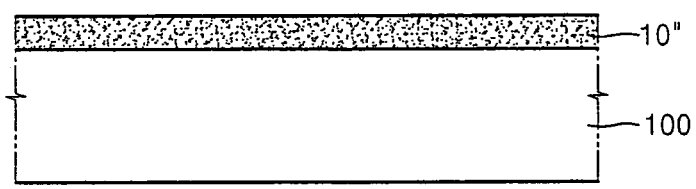
FIGS. 4A through 4D are cross-sectional views illustrating a method of manufacturing the TFT of FIG. 2, according to example embodiments.

Referring to FIG. 4A, a semiconductor material layer 10" may be formed on a substrate 100. The semiconductor material layer 10" may be the same material layer as the lower layer 10 of the TFT of FIG. 1, however, it may be formed to be thicker than the lower layer 10. For example, the semiconductor material layer 10" may be formed to the same thickness as the channel layer 110 of the TFT of FIG. 1.

Figure 4B:
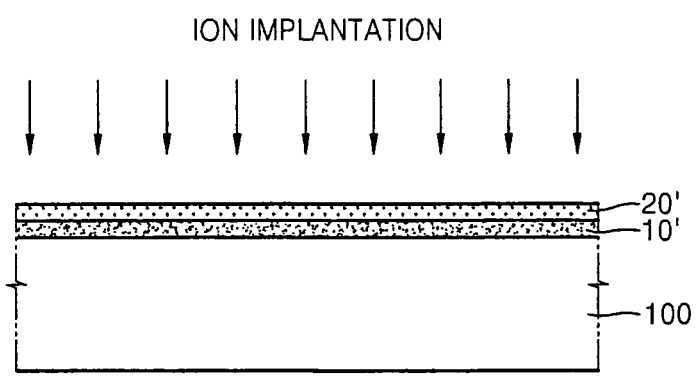

Referring to FIG. 4B, a carrier acceptor that may reduce the carrier (electrons) concentration of the semiconductor material layer 10" may be, for example, ionically injected into the upper portion of the semiconductor material layer 10". The carrier acceptor may comprise one or more of Cu, Ag, Li, Na, K, Mg, Ca, Be, Au, Rg, Ni, Co, Rh, Pd, Ir, Pt, V, Nb, Ta, and N. The concentration of the carrier acceptor may be greater than or equal to about $10^5$ atoms/cm$^3$ and less than or equal to about $10^{24}$ atoms/cm$^3$. The carrier acceptor may be injected, for example, only into an upper layer 20' of the semiconductor material layer 10" and/or not injected into a lower layer 10' of the semiconductor material layer 10".

Figure 4C:
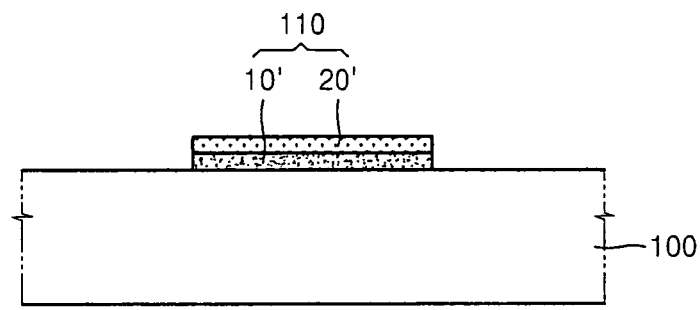
Figure 4D:
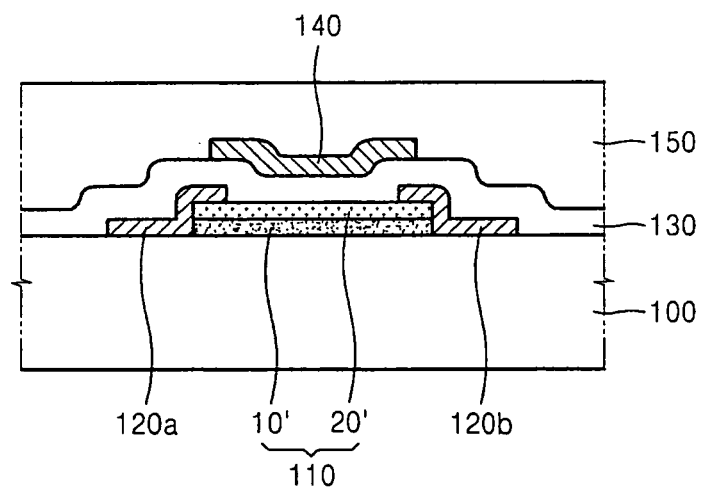

Referring to FIG. 4C, a channel layer 110 having a double layer structure may be formed by patterning the upper layer 20' and/or the lower layer 10'. The channel layer 110 of FIG. 4C may be equivalent to the channel layer 110 of FIG. 1.

A method of forming the TFT after forming of the channel layer 110 may be similar or identical to the method of forming the TFT of FIG. 1. As a result, a TFT depicted in FIG. 4D may be manufactured.

FIGS. 5A through 5D are cross-sectional views illustrating a method of manufacturing a TFT according to example embodiments. The purpose of the method may be to manufacture the TFT having a bottom gate structure. Like reference numerals of elements in FIGS. 5A through 5D are used to indicate similar or identical elements in FIG. 2.

Figure 5A:
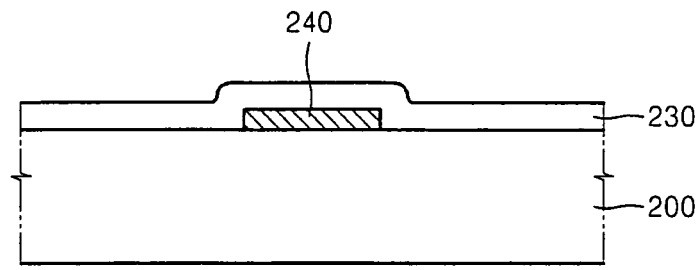
FIGS. 5A through 5D are cross-sectional views illustrating a method of manufacturing a TFT according to example embodiments.

Referring to FIG. 5A; the gate electrode 240 may be formed on the substrate 200. The gate insulating layer 230, that may cover the gate electrode 240, may be formed on the substrate 200.

Figure 5B:
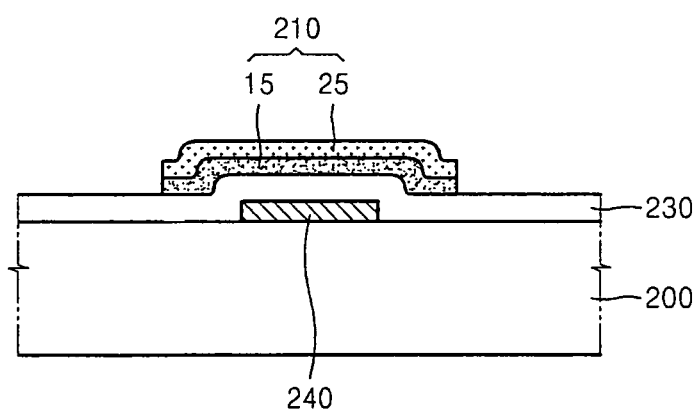

Referring to FIG. 5B, the channel layer 210, that may have a double-layer structure, may be formed on the gate insulating layer 230. The channel layer 210 may be, for example, located above the gate electrode 240. In example embodiments, the channel layer 210 may be formed using the methods of forming the channel layers 110 of FIGS. 3A and 3B, or FIGS. 4A through 4C, and may be similar or identical to the channel layer 210 of FIG. 2.

Figure 5C:
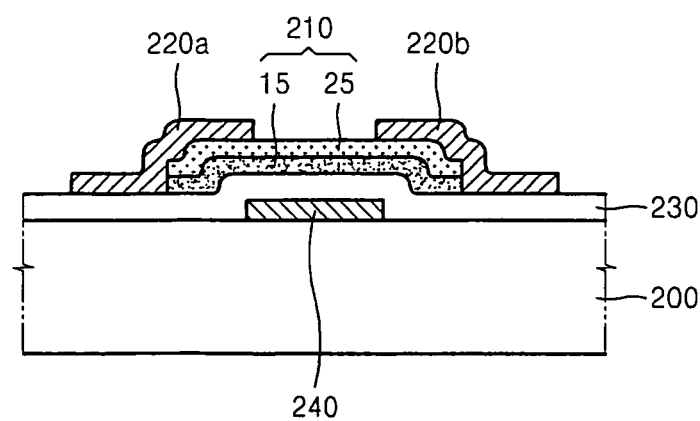

Referring to FIG. 5C, the source electrode 220a and/or the drain electrode 220b, that may contact different portions of the channel layer 210 and/or may expose a portion of an upper surface of the channel layer 210, may be formed on the gate insulating layer 230.

Figure 5D:
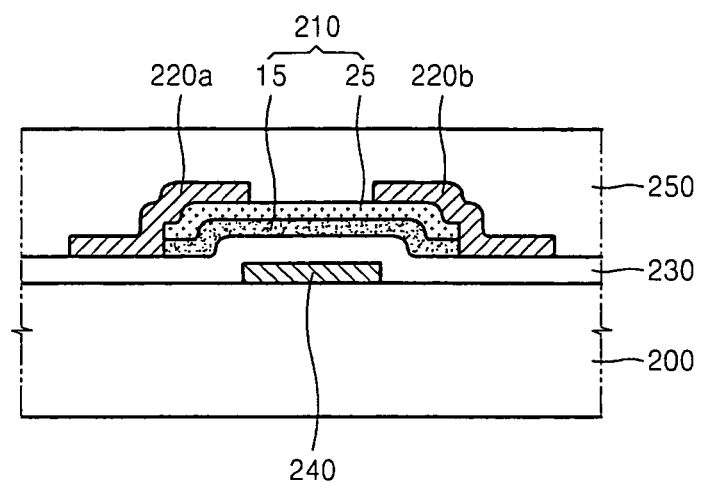

Referring to FIG. 5D, the passivation layer 250, that may cover the exposed portion of the channel layer 210, the source electrode 220a, and/or the drain electrode 220b, may be formed on the substrate 200.

As described above, in the methods of manufacturing the TFTs according to example embodiments, the channel layers 110 and 210 may be formed in a double-layer structure, and the upper layers 20, 20', and/or 25 may have an electrical resistance higher than that of the lower layers 10, 10', and/or 15. Accordingly, a severe reduction of electrical resistance of the channel layer(s) 110 and/or 210 due to plasma used for patterning the source and drain electrode layer(s) 120 and/or 220 and/or for forming the gate insulating layer(s) 130 and/or 230 or the passivation layer(s) 150 and/or 250 may be reduced and/or prevented, and thus, a characteristic degradation of the TFT according to example embodiments may be reduced and/or prevented.

Figure 6:
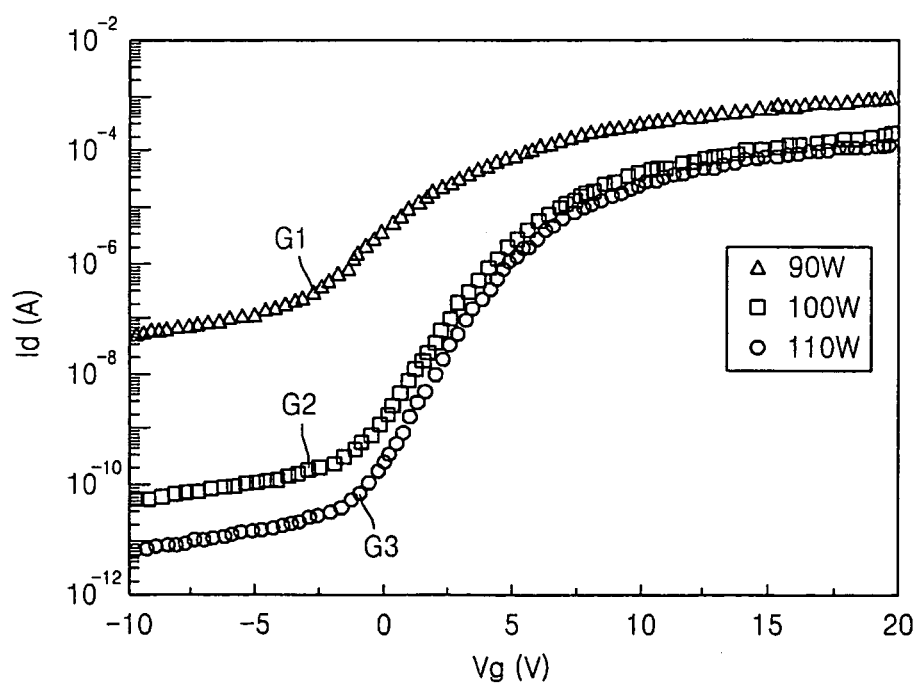
FIGS. 6 and 7 are graphs illustrating drain current $I_d$ versus gate voltage $V_g$ characteristics of a TFT that is manufactured at various conditions, according to example embodiments.
Figure 7:
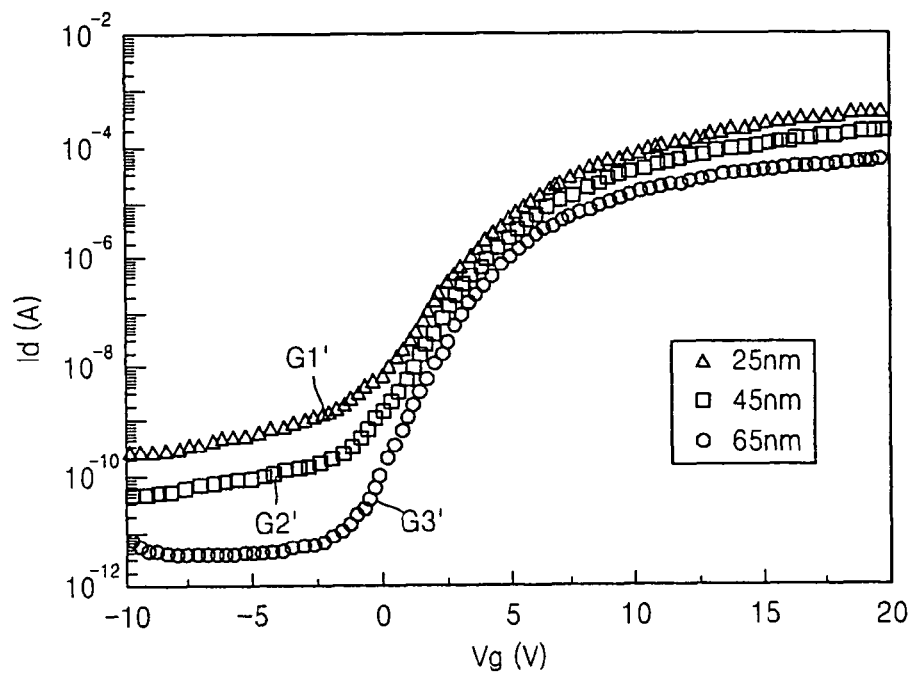

FIGS. 6 and 7 are graphs illustrating drain current $I_d$ versus gate voltage $V_g$ characteristics of a TFT that is manufactured at various conditions, according to example embodiments. FIGS. 6 and 7 show the drain current $I_d$ versus gate voltage $V_g$ characteristics of a TFT that may use a Ga—In—Zn—O layer doped with Cu, which is formed by using a sputtering method using two targets, as the upper layer 20. A first target including Cu and a second target including GIZO are used in the sputtering method.

FIG. 6 shows the drain current $I_d$ versus gate voltage $V_g$ characteristics of the TFT, at various powers that are used for sputtering the first target in the sputtering method. First, second and third plots G1, G2 and G3 illustrated in FIG. 6 show the drain current $I_d$ versus gate voltage $V_g$ characteristics of the TFT including the upper layer 20 that is formed by sputtering the first target at powers of 90 W, 100 W and 110 W, respectively. A power of 400 W is used for sputtering the second target.

Referring to FIG. 6, all of the first, second and third plots G1, G2 and G3 show switching characteristics. However, when a power (hereinafter, referred to as a first power) used for stuttering the first target is increased, the switching characteristics of the TFT is better. Cu content of the upper layer 20 that is formed by using the first power of 90 W, 100 W or 110 W is increased from 29 atomic % to 44 atomic %, as the first power is increased from 90 W to 110 W. Accordingly, when the upper layer 20 includes appropriate Cu content, the switching characteristics of the TFT can be excellent.

FIG. 7 shows the drain current $I_d$ versus gate voltage $V_g$ characteristics of the TFT, according to various thicknesses of the upper layer 20. First, second and third plots G1', G2' and G3' illustrated in FIG. 7 show the drain current $I_d$ versus gate voltage $V_g$ characteristics of the TFT including the upper layer 20 that has thicknesses of 25 nm, 45 nm and 65 nm, respectively. Here, when the upper layer 20 is formed, a power of 110 W is used for sputtering the first target, and a power of 400 W is used for sputtering the second target.

Referring to FIG. 7, all of the first, second and third plots G1', G2' and G3' show switching characteristics. However, when the thickness of the upper layer 20 is increased, the switching characteristics of the TFT are better. Accordingly, the upper layer 20 can have a thickness in the range of 25 to 65 nm, or alternatively, in the range of 10 to 100 nm.

Figure 8:
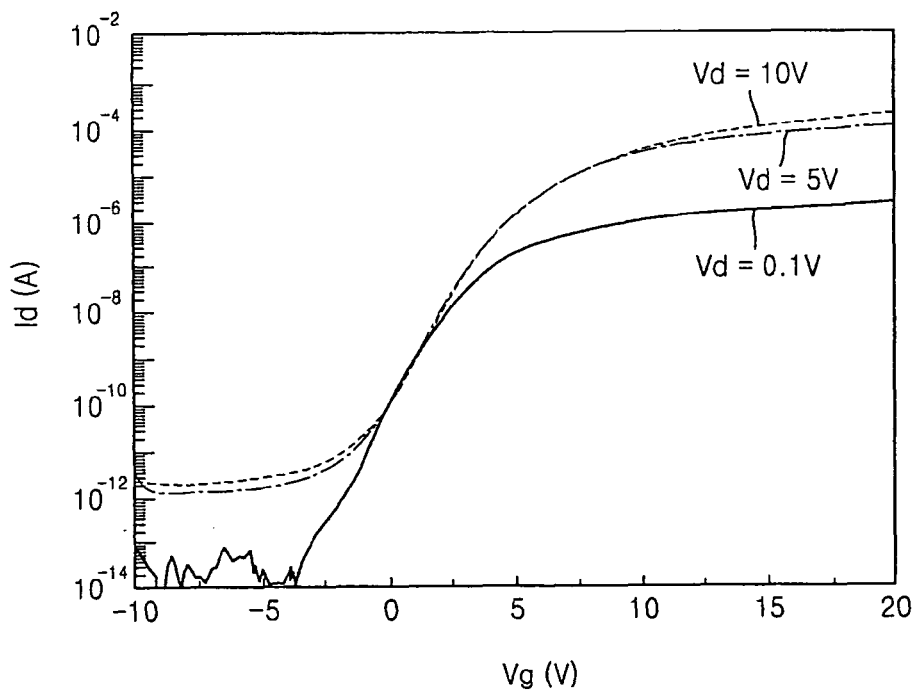
FIG. 8 is a graph illustrating drain current $I_d$ versus gate voltage $V_g$ characteristics of a TFT that is manufactured at a first condition that is obtained based on the results of FIGS. 6 and 7, at various drain voltages $V_d$.

FIG. 8 is a graph illustrating drain current $I_d$ versus gate voltage $V_g$ characteristics of a TFT that is manufactured at a first condition that is obtained based on the results of FIGS. 6 and 7, at various drain voltages $V_d$. In particular, a Ga—In—Zn—O layer doped with Cu is formed to have a thickness of about 65 nm as the upper layer 20, wherein a power of about 100 W is used for sputtering the first target when the upper layer 20 is formed.

Figure 9:
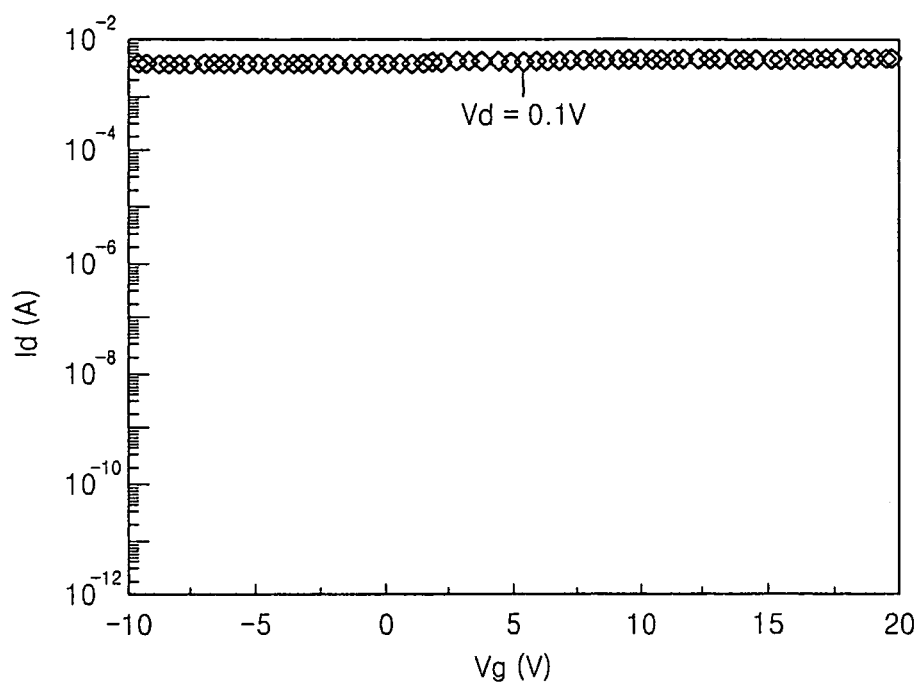
FIG. 9 is a graph illustrating drain current $I_d$ versus gate voltage $V_g$ characteristics of a comparative TFT compared with a TFT according to example embodiments.

FIG. 9 is a graph illustrating drain current $I_d$ versus gate voltage $V_g$ characteristics of a comparative TFT. That is, the drain current $I_d$ vs. gate voltage $V_g$ characteristics of a TFT having a single Ga—In—Zn—O layer as the channel layer 110.

Referring to FIGS. 8 and 9, the TFTs according to example embodiments may show excellent switching characteristics at a high drain voltage $V_d$ of about 10 V. However, the comparative TFT does not show switching characteristics at a low drain voltage $V_d$ of about 0.1 V.

Figure 10:
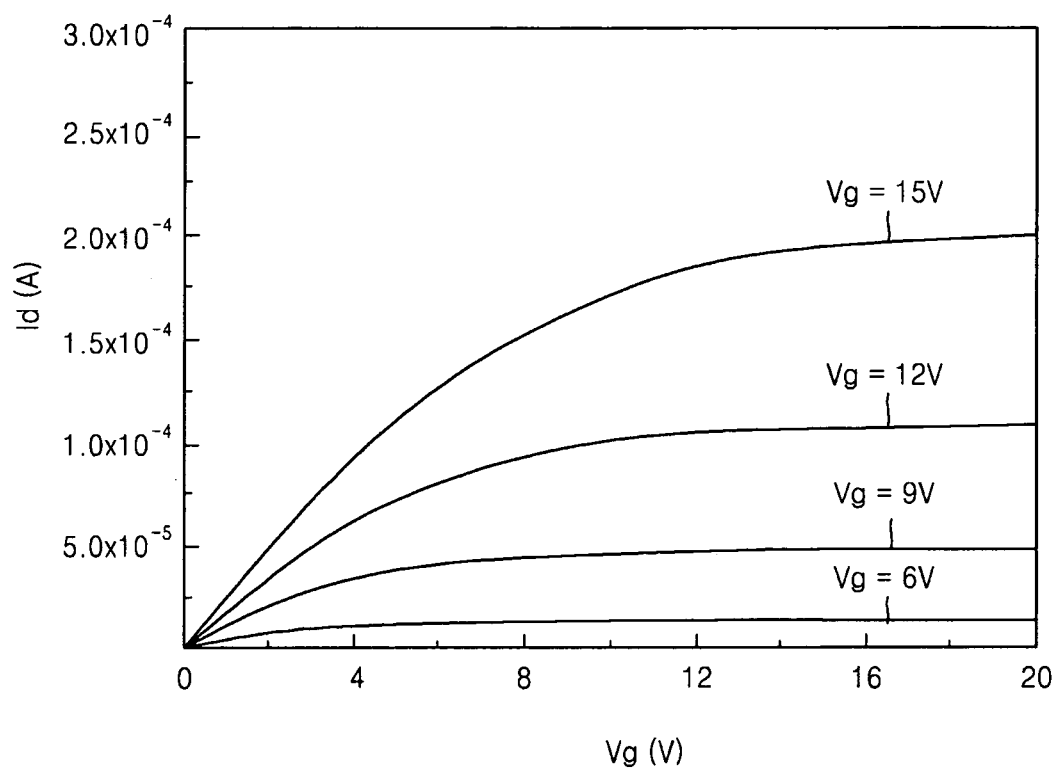
FIG. 10 is a graph illustrating drain current $I_d$ versus drain voltage $V_d$ characteristics of a TFT that is manufactured at a first condition, at various gate voltages $V_g$, according to example embodiments.

FIG. 10 is a graph illustrating drain current $I_d$ versus drain voltage $V_d$ characteristics of a TFT that is manufactured at the first condition, at various gate voltages $V_g$, according to example embodiments.

Referring to FIG. 10, as the drain voltage $V_d$ is increased, the drain current $I_d$ is increased to be constant. This is similar to the characteristics of common switching devices.

Figure 11:
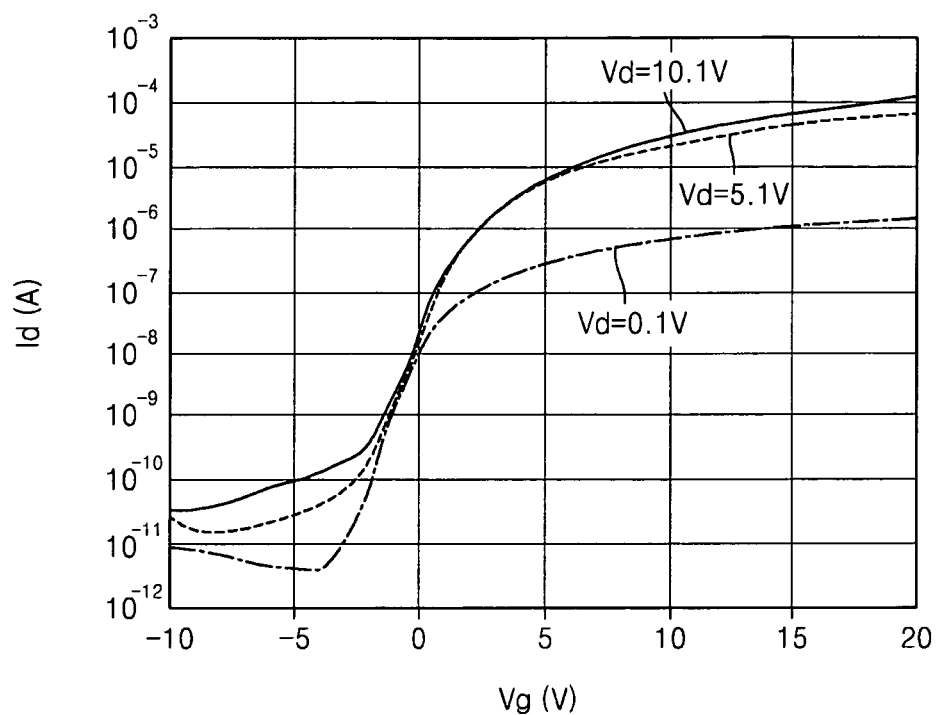
FIG. 11 is a graph illustrating drain current $I_d$ versus gate voltage $V_g$ characteristics of a TFT manufactured by using a method, at various drain voltages $V_d$, according to example embodiments.

FIG. 11 is a graph illustrating characteristics of a TFT manufactured by using a method according to example embodiments, and shows drain current $I_d$ versus gate voltage $V_g$ characteristics of the TFT in which a Ga—In—Zn—O layer doped with N is used as the upper layer 20, at various drain voltages $V_d$. Here, the Ga—In—Zn—O layer doped with N is formed by using a method in which when a GIZO target is sputtered at a power of 400 W, a $N_2$ gas flows at a speed of about 25 sccm, and a $N_2$ gas and a $O_2$ gas flow at speeds of about 100 sccm and 10 sccm, respectively.

Referring to FIG. 11, the TFT, in which the Ga—In—Zn—O layer doped with N is used as the upper layer 20, according to example embodiments, may show excellent switching characteristics at a high voltage $V_d$ of about 10.1V.

As described above, the TFTs according to example embodiments may have a channel layer having a double-layer structure in which the upper layer has a carrier concentration lower than that of the lower layer. Thus, the degradation of the channel layer due to plasma may be reduced and/or prevented. Accordingly, the high speed charge mobility of the channel layer may be secured.

Also, the lower layer and/or the upper layer may be formed in a in-situ process using the same equipment, and/or may be formed by an ionic injection of a carrier acceptor into a semiconductor material layer. Accordingly, the methods of manufacturing the TFTs according to example embodiments may not require new equipment or masking processes, thereby, simplifying the manufacturing process.

Additionally, the constituent elements and structure of a TFT may be modified in various ways. For example, the TFT may be applied to a liquid crystal display apparatus, an organic light emitting display apparatus, a memory device, and/or a logic device.

While example embodiments have been particularly shown and described, it will be understood by those of ordinary skill in the art that various changes in form and details may be made therein without departing from the spirit and scope of the present invention as defined by the following claims.

What is claimed is:

1. A thin film transistor, comprising:
   a gate insulating layer;
   a gate electrode formed on a bottom side of the gate insulating layer;
   a channel layer formed on a top side of the gate insulating layer;
   a source electrode that contacts a first portion of the channel layer; and
   a drain electrode that contacts a second portion of the channel layer;
   wherein the channel layer has a double-layer structure, including an uppermost layer and a lower layer, the lower layer being disposed between the uppermost layer and the gate insulating layer,
   wherein the uppermost layer has a carrier concentration lower than that of the lower layer, and
   wherein the uppermost layer is doped with a carrier acceptor in order to have an electrical resistance higher than that of the lower layer.

2. The transistor of claim 1, wherein the channel layer is formed of a ZnO based material.

3. The transistor of claim 1, wherein the channel layer is formed of $a(In_2O_3).b(Ga_2O_3).c(ZnO)$, and
   where a, b, and c are real numbers such that $a \geq 0$, $b \geq 0$, and $c > 0$.

4. The transistor of claim 1, wherein the carrier acceptor comprises one or more of Cu, Ag, Li, Na, K, Mg, Ca, Be, Au, Rg, Ni, Co, Rh, Pd, Ir, Pt, V, Nb, Ta, and N.

5. The transistor of claim 4, wherein the carrier acceptor comprises Cu, and
   wherein the Cu content of the uppermost layer is 29-44 atomic %.

6. The transistor of claim 5, wherein a thickness of the uppermost layer is greater than or equal to 10 nm and less than or equal to 100 nm.

* * * * *